United States Patent [19]

Katayama et al.

[11] Patent Number: 5,705,027
[45] Date of Patent: Jan. 6, 1998

[54] METHOD OF REMOVING ETCHING RESIDUES

[75] Inventors: Toshiharu Katayama; Naoko Ootani, both of Itami, Japan

[73] Assignee: Mitsubishi Denki Kabushiki Kaisha, Tokyo, Japan

[21] Appl. No.: 551,597

[22] Filed: Nov. 1, 1995

[30] Foreign Application Priority Data

Apr. 18, 1995 [JP] Japan ................... 7-092421

[51] Int. Cl.$^6$ ........................... H01L 21/306
[52] U.S. Cl. ................... 156/628.1; 156/657.1; 156/662.1; 437/228; 437/985; 205/124; 205/157; 205/223
[58] Field of Search ................ 156/628.1, 662.1, 156/657.1; 205/124, 157, 223; 437/228, 985

[56] References Cited

U.S. PATENT DOCUMENTS

| | | | |
|---|---|---|---|
| 3,882,000 | 5/1975 | Schwartz et al. | 205/157 |
| 4,026,741 | 5/1977 | Chang et al. | 205/157 |
| 4,227,975 | 10/1980 | Hartman et al. | 205/124 |
| 4,261,792 | 4/1981 | Tsuji et al. | 205/157 |
| 4,305,760 | 12/1981 | Trudel | 148/105 |
| 4,363,696 | 12/1982 | Nagakubo et al. | 156/643.1 |
| 4,542,579 | 9/1985 | Poponiak et al. | 205/124 |
| 5,129,982 | 7/1992 | Wang et al. | 156/628.1 |
| 5,188,988 | 2/1993 | Teherani et al. | 205/157 |
| 5,534,460 | 7/1996 | Tseng et al. | 437/187 |
| 5,549,006 | 8/1996 | Kurtz | 73/708 |

FOREIGN PATENT DOCUMENTS

| | | |
|---|---|---|
| 56-96863 | 8/1981 | Japan. |
| 61-34947 | 2/1986 | Japan. |
| 61-137329 | 6/1986 | Japan. |
| 63-34947 | 2/1988 | Japan. |

*Primary Examiner*—R. Bruce Breneman
*Assistant Examiner*—Anita Alanko
*Attorney, Agent, or Firm*—Lowe, Price, LeBlanc & Becker

[57] ABSTRACT

The method is to selectively etch the etching residue in non-conductive state occurring in semiconductor manufacturing process. A silicon substrate cassette is used in such selective etching.

In removing the etching residue in non-conductive state occurring in semiconductor manufacturing process, by applying a positive potential to part of conductive silicon substrates in an etching solution, the contact surfaces between the silicon substrates and the portion electrically connected thereto and the chemical etching solution are anodically oxidized to protect with a passive film, while only the etching residue in non-conductive state is selectively removed by isotropic etching, thereby achieving the purpose.

7 Claims, 11 Drawing Sheets

METHOD OF REMOVING ETCHING RESIDUES

BACKGROUND OF THE INVENTION

1. Field of the Invention

The present invention relates to a manufacturing method of a semiconductor device for selectively removing the etching residue on a silicon substrate, and a silicon substrate cassette for selective etching for use in such manufacturing method.

2. Description of Related Art

A conventional MOS type semiconductor device is generally composed as follows. As shown in FIG. 19, reference numeral 101 is a p type Si substrate, 102 is an element separation oxide film, 103 is a gate oxide film, 104 is a gate electrode, 105a, 105b are n+ impurity diffusion layers, 106 is an interlayer insulating film, 107 is an opening formed by opening the interlayer insulating film 106 to expose part of the impurity diffusion layer 105a, 108 is a low resistance polycrystalline silicon film, 109 is a resist pattern, 110 is a capacitor lower electrode, 111 is a residue of the low resistance polycrystalline silicon film 108, 112 is a capacitor dielectric film, 113 is a capacitor upper electrode, 114 is an interlayer insulating film, 115 is an opening formed by opening the interlayer insulating films 106 and 114 to expose part of the impurity diffusion layer 105b, and 116 is a bit line electrode.

In the semiconductor device, first as shown in FIG. 14 and FIG. 20, a separation oxide film (a thick silicon oxide film) 102 for element separation is formed by LOCOS method in a specified region on a principal surface of the p type single crystal substrate 101, and a gate oxide film layer (not shown) is formed on the entire surface by thermal oxidation method, then a low resistance polycrystalline silicon layer (not shown) is formed on the gate oxide film layer by CVD method. Then, by patterning by lithographic technique and dry etching technique, the gate oxide film 103 and gate electrode 104 are formed. Using the gate electrode 104 as mask, by implanting As ions in the condition of 50 keV, $4 \times 10^{15}$ cm$^{-2}$, a pair of n+ impurity diffusion layers (source/drain regions) 105a, 105b are formed by self-aligning. Afterwards, by heat treatment, the n+ impurity diffusion layers 105a, 106b are electrically activated.

Consequently, as shown in FIG. 15 and FIG. 21, the interlayer insulating film 106 is formed on the entire surface by CVD method, and the opening 107 is formed in the region positioned on the impurity diffusion layer 105a of the interlayer insulating film 106 by lithographic technique and dry etching technique. As a result, part of the n+ impurity diffusion layer 105a is exposed.

Furthermore, as shown in FIG. 16 and FIG. 22, the low resistance polycrystalline silicon layer 108 doped with phosphorus (P) is formed so as to connect electrically with the n+ impurity diffusion layer 105a exposed by CVD technique and extend on the interlayer insulating film 106, and a resist pattern 109 is formed on the low resistance polycrystalline silicon layer 108 by lithographic technique. As shown in FIG. 17 and FIG. 23, the resist pattern 109 is transferred by anisotropic dry etching technique represented by reactive ion etching (RIE), and the capacitor lower electrode 110 is formed. By this anisotropic dry etching, the low resistance polycrystalline silicon residue 111 is formed as side wall in the step portion.

Next, as shown in FIG. 18 and FIG. 24, the capacitor dielectric film 112 is formed on the capacitor lower electrode 110. The capacitor dielectric film 112 is composed of a single layer film such as thermal oxide film, a multi-layer film such as composition of silicon oxide film/silicon nitride film/silicon oxide film, Ta$_2$O$_5$, or the like.

Then, after forming a low resistance polycrystalline silicon thin film (not shown) by CVD method, the capacitor upper electrode 113 is formed by lithographic technique and dry etching technique.

Sequentially, as shown in FIG. 19 and FIG. 25, the interlayer insulating film 114 is formed on the entire surface by CVD method. By lithographic technique and dry etching technique, afterwards, the opening 115 is formed in a region positioned above the n+ impurity diffusion layer 105b of the interlayer insulating films 106 and 114. As a result, part of the n+ impurity diffusion layer 105b and low resistance polycrystalline silicon residue 111 are exposed.

Finally, by CVD method, a low resistance polycrystalline silicon film (not shown) is formed so as to connect electrically with the exposed n+ impurity diffusion layer 105b and extend over the interlayer insulating film 114, and the bit line electrode 116 is formed by lithographic technique and dry etching technique.

In such conventional method, however, since the low resistance polycrystalline silicon residue 111 is left over in a linear form as shown in FIG. 23, a high resistance shorting occurs between the adjacent capacitor lower electrodes 110 fabricated on the low resistance polycrystalline silicon residue, and high resistance shorting also occurs on every other bit line 116 fabricated on the interlayer insulating film 114 as shown in FIG. 25.

To remove the etching residue occurring in the semiconductor manufacturing process, a wet process for removing the etching residue by immersing the substrate in an alkaline etching solution after anisotropic etching is known, but since the usual wet etching is isotropic etching, and other portions than the etching residue are similarly etched, and the pattern size varies in the semiconductor memory device or the like using the superfine processing technology, in particular, which is inconvenient in characteristics.

In this invention, by making use of the selective chemical etching method (Japanese Laid-open Patent Sho. 61-34947) for forming a protective film by anodic oxidation of the necessary portion before removal of etching residue, and removing only the residue portion by ordinary isotropic etching while protecting this portion, it is an object to present a selective chemical etching method for selectively removing the etching residue occurring in the semiconductor manufacturing process easily and simultaneously on a plurality of silicon substrates, and a silicon substrate cassette suited to such plurality processing.

SUMMARY OF THE INVENTION

The inventors, as a result of intensive studies, discovered that, in the MOS type semiconductor device, the substrates and the portion electrically connected therewith can be protected against chemical etching employed in second etching step, while the silicon left over on the interlayer insulating film can be selectively removed by chemical etching, only by applying a positive potential to any part of the silicon substrates by employing the selective etching method because the silicon left over on the interlayer insulating film as the residue in the first etching step is non-conductive to the silicon substrates and the other portions including the capacitor electrode are conductive to the silicon substrates, thereby reaching the completion of the invention.

That is, the invention presents a manufacturing method of semiconductor device comprising a first etching step comprising a step of forming a gate electrode on a silicon substrate and an impurity diffusion layer between the gate electrodes, a step of forming an interlayer insulating film over the gate electrode and impurity diffusion layer and forming an opening on the impurity diffusion layer of the interlayer insulating film, a step of forming a silicon film on the interlayer insulating film and on the impurity diffusion layer in the bottom region of the opening through the opening, a step of anisotropically etching the silicon on the interlayer insulating film by using a resist pattern and forming a remaining silicon film as a capacitor lower electrode, and a second etching step comprising a step of immersing the silicon substrate in a chemical etching solution and applying a positive potential to the silicon substrate, a step of forming a passive film by anodically oxidizing the contact surface of the silicon substrate and a portion electrically connected thereto, with the chemical etching solution and a step of isotropically etching to remove the residue of the first etching step in the non-conductive state left over on the interlayer insulating film.

In particular, the residue of the silicon in non-conductive state is usually composed of polycrystalline silicon.

In the invention, a positive potential of several volts to scores of volts to the chemical etching solution is applied to the silicon substrate, and the chemical etching solution is a solution composed of any one selected from the group consisting of KOH, NaOH, LiOH, CsOH, $NH_4OH$, ethylene diamine pyrocatechol, hydrazine, and choline, and the temperature of the chemical etching solution is preferred to be 60° to 70° C.

Especially, as the chemical etching solution of polycrystalline silicone, 5N KOH solution is suited.

Moreover, the invention is preferred to be employed as a method of processing the etching residue on two or more silicon substrates simultaneously. In this case, the method of the invention is preferred to be executed by using a cassette made of a conductive material used for selective etching, that is, a silicon substrate cassette disposing plural silicon substrates on the cassette oppositely at a specific interval in a detachable state, so that a positive potential may be applied to the silicon substrates from the surrounding through the cassette by connecting a power source positive electrode to the cassette.

Therefore, the invention presents a silicon substrate cassette capable of processing the plural silicon substrates simultaneously.

Power feeding from the cassette may be done from around the silicon substrates through an engaging portion disposing detachably the silicon substrates, but it may be also designed to feed power from the back side to the silicon substrates disposed so as to contact with the electrodes through the substrate application electrodes by the substrate application electrodes by disposing oppositely plural flat silicon substrate application electrodes so as to be disposed in contact with the silicon substrates at specific interval on the cassette.

The grounding electrodes may be disposed outside of the cassette, but it may be also disposed parallel to the silicon substrates on the cassette. In this case, the flat grounding electrodes are mounted on the conductive cassette through insulators.

The residue on the silicon substrate is present on the substrate surface, and it is essential to dispose so that the surface of the silicon substrate may confront the grounding electrode. Therefore, the silicon substrate and grounding electrode are alternately disposed parallel, or the surfaces of the silicon substrates may be disposed oppositely across the grounding electrode.

The cassette may be a silicon substrate cassette mounting flat grounding electrodes parallel to the electrodes, between electrodes of the silicon substrate application electrodes disposed oppositely on the cassette.

The cassette may be also a silicon substrate cassette mounting flat grounding electrodes parallel at a specific interval, and oppositely disposing flat silicon substrate application electrodes so as to be disposed in contact with the silicon substrates at both sides of the grounding electrodes.

According to the invention, in addition to the conventional manufacturing process of semiconductor device comprising a first etching step comprising a step of forming a gate electrode on a silicon substrate and an impurity diffusion layer between the gate electrode, a step of forming an interlayer insulating film over the gate electrode and impurity diffusion layer and forming an opening on the impurity diffusion layer of the interlayer insulating film, a step of forming a silicon film on the interlayer insulating film and on the impurity diffusion layer in the bottom region of the opening through the opening, a step of anisotropically etching the silicon on the interlayer insulating film by using a resist pattern and forming a remaining silicon film as a capacitor lower electrode (FIGS. 1 to 4, 6 and 7), it further comprises a second etching step comprising a step of immersing the silicon substrate in a chemical etching solution and applying a positive potential to the silicon substrate, a step of forming a passive film by anodically oxidizing the contact surface of the silicon substrate and a portion electrically connected thereto, with the chemical etching solution and a step of isotropically etching to remove the residue of the first etching step in the non-conductive state left over on the interlayer insulating film (FIG. 5), whereby the silicon residue (FIG. 23) on the interlayer insulating film can be selectively removed while protective the silicon substrate surface by the passive film, and shorting between the adjacent capacitor lower electrodes or bit lines caused due to the silicon residue in the prior art can be prevented.

The silicon residue on the interlayer insulating film is usually polycrystalline silicon, but using the above method also in the polycrystalline silicon, the residue can be removed selectively, and shorting due to residue can be prevented.

In the selective etching process of the silicon residue, by defining the positive potential to be applied to the silicon substrate at several volts to scores of volts, the contact surface of the silicon substrate and its electrically connected portion with the etching solution can be favorably oxidized anodically to form a passive film, so that etching of the necessary element portions such as silicon substrate surface can be prevented.

The silicon residue can be favorably removed by a solution of any one of KOH, NaOH, LiOH, CsOH, $NH_4OH$, ethylene diamine pyrocatechol, hydrazine, and choline, and especially by using 5N KOH solution. Besides, a favorable etching speed can be obtained by defining the temperature of the chemical etching solution at 60 to 70° C.

Also according to the invention, by feeding current only to part of the conductive silicon substrate in a chemical etching solution, the contact surface of the silicon substrate and its electrically connected portion with the etching solution can be favorably oxidized anodically to form a passive film so as to protect, while the non-conductive silicon on the interlayer insulating film can be selectively removed, and hence by immersing plural silicon substrates in a chemical etching solution and feeding current, selective removal of the etching residue on the plural silicon substrates can be done by one etching step.

In particular, in simultaneous etching process of plural silicon substrates, by using the conductive silicon substrate of the invention, that is, the silicon substrate cassette (FIG. 8) having plural silicon substrates mounted on the cassette oppositely at a specific interval in a detachable state, and capable of applying a positive potential simultaneously from the surrounding to one or two or more silicon substrates disposed on the cassette by applying a positive potential to the cassette main body, current feeding to the plural silicon substrates may be easy.

In such cassette, moreover, by mounting flat grounding electrodes on the cassette together with an insulators alternately and parallel to the oppositely disposed silicon substrates (FIG. 9), the intra-plane uniformity of etching of silicon residue can be enhanced.

Above all, by disposing so that the silicon substrate may be held on both sides by the grounding electrode and that the silicon substrate surface may confront the grounding electrode (FIG. 10), the intra-plane uniformity of etching of the silicon substrate may be enhanced, and the required number of grounding electrodes necessary for etching may be decreased to half of the prior art.

Moreover, according to the invention, by oppositely disposing plural flat silicon substrate application electrodes that can be disposed in contact with the silicon substrate at a specific interval on a cassette made of non-conductive material, and applying a positive potential from the back to the silicon substrates disposed in contact with the electrodes through the substrate application electrodes (FIG. 11), the contact area between the substrate application electrodes and silicon substrates becomes wider, and more uniform current application to the silicon substrates is realized, so that the intra-plane uniformity of residue etching may be enhanced.

In this cassette, by mounting flat grounding electrodes so as to be alternate and parallel to the substrate application electrodes disposed oppositely (FIG. 12), or by disposing so that the substrate application electrodes may hold the grounding electrodes on both sides and that the silicon substrate surface on the substrate application electrode may confront the grounding electrode (FIG. 13), the intra-plane uniformity of etching of the silicon residue may be enhanced, and in the latter case the number of grounding electrodes necessary for etching may be decreased to half of the prior art.

BRIEF DESCRIPTION OF THE DRAWINGS

The above and other objectives and features of the present invention will become more apparent from the following description of a preferred embodiment thereof with reference to the accompanying drawings, throughout which like parts are designated by like reference numerals, and wherein.

DETAILED DESCRIPTION OF THE PREFERRED EMBODIMENTS

Embodiment 1

Figure 1:
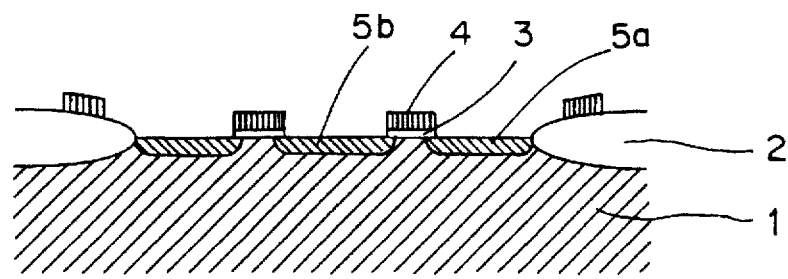
FIG. 1 through FIG. 7 schematically illustrate sequential stages in accordance with an embodiment of the present invention.

FIG. 1 to FIG. 7 are process sectional views showing a manufacturing method of semiconductor device according to the invention.

In the drawings, reference numeral 1 denotes a Si substrate, 2 is an element separation oxide film, 3 is a gate oxide film, 4 is a gate electrode, 5a, 5b are impurity diffusion layers, 6 is an interlayer insulating film, 7 is an opening formed by opening the interlayer insulating film 6 and exposing part of the impurity diffusion layer 5a, 8 is a polysilicon film, 9 is a resist pattern, 10 is a capacity lower electrode, 11 is a residue of low resistance polycrystalline silicon film 8, 12 is a capacitor dielectric film, 13 is a capacitor upper electrode, 14 is an interlayer insulating film, 15 is an opening formed by opening the interlayer insulating films 6 and 14 and exposing part of the impurity diffusion layer 5b, 17 is a chemical etching solution, 18 is a direct-current voltage power source, 19 is a grounding electrode, and 20 is a wet removing device having the direct-current voltage power source 18 and grounding electrode 19.

First, as shown in FIG. 1, the separation oxidation film (thick silicon oxide film) 2 is formed for element separation by LOCOS method, in a specified region on a principal surface of the p type single crystal silicon substrate 1.

Next, by thermal oxidation method, a gate oxide film layer (not shown) is formed on the entire surface, and a low resistance polycrystalline silicon layer (not shown) is deposited on the gate oxide film layer by CVD method.

Consequently, by patterning by lithographic technique and dry etching technique, the gate oxide film 3 and gate electrode 4 are formed. Using the gate electrode 4 as mask, by implanting As ions in the condition of 50 keV$\times 4 \times 10^{15}$ cm$^{-2}$, a pair of n$^+$ impurity diffusion layers (source/drain region) 5a, 5b are formed by self-aligning. By heat treatment, afterwards, the n$^+$ impurity diffusion layers 5a, 5b can be activated electrically.

Figure 2:
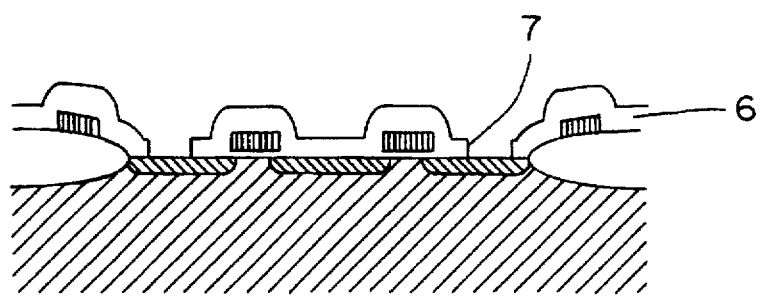

Then, as shown in FIG. 2, the interlayer insulating film 6 is formed on the entire surface by CVD method. Furthermore, in a region positioned on the impurity diffusion layer 5a of the interlayer insulating film 6, the opening 7 is formed by the lithographic technique and dry etching technique. As a result, part of the n$^+$ impurity diffusion layer 5a is exposed.

Figure 3:
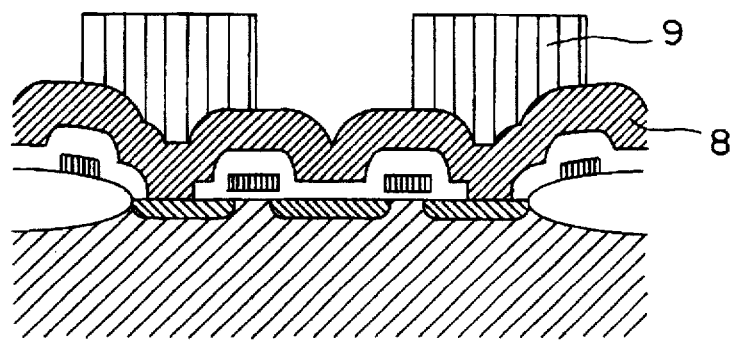

As shown in FIG. 3, subsequently, the low resistance polycrystalline silicon film 8 doped with phosphorus (P) is formed so as to connect electrically with the n$^+$ impurity diffusion layer 5a exposed by the CVD method and extend over the interlayer insulating film 6, the resist pattern 9 is formed by using the lithographic technique on the low resistance polycrystalline silicon layer 8.

Figure 4:
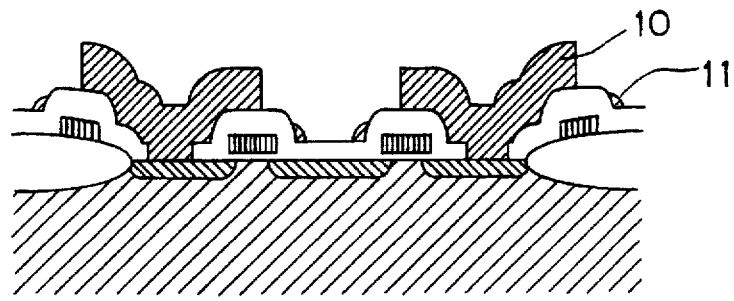

Now, as shown in FIG. 4, by an anisotropic dry etching technique represented by RIE, the resist pattern 9 is transferred, and the capacitor lower electrode 10 is formed. By this anisotropic dry etching, the low resistance polycrystalline silicon residue 11 is formed in the step as side wall.

Figure 5:
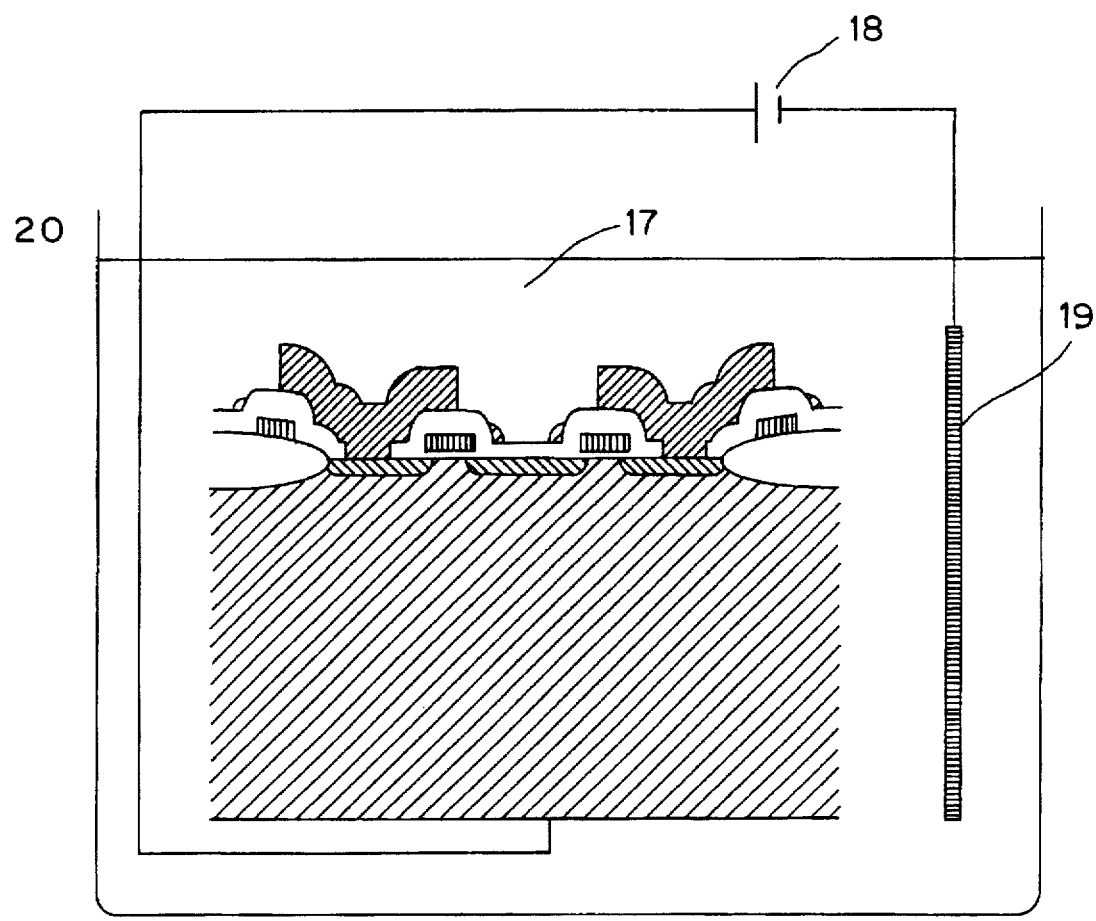

Further, as shown in FIG. 5, by using the wet removing device 20 comprising chemical etching solution 17, direct-current voltage power source 18, and grounding electrode 19, the low resistance polycrystalline silicon residue 11 is selectively removed by chemically etching with a direct-current voltage applied to the silicon substrate 1.

Typical examples of chemical etching solution are KOH, NaOH, LiOH, CsOH, NH4OH, ethylene diamine pyrocatechol, hydrazine, and choline.

When 5N KOH heated to 60° C. is used as chemical etching solution, by applying a direct-current voltage of several volts to scores of volts to the silicon substrates 1, the capacitor lower electrode 10 comes to be same in potential as the silicon substrates, and a passive layer for stopping electrochemical etching is formed on the surface of the silicon substrates 1 and capacitor lower electrode 10.

On the other hand, the low resistance polycrystalline silicon residue 11 does not conduct with the silicon substrates, or conducts through a high resistance element, and therefore voltage is not applied, or if applied, the voltage drops through the capacitor lower electrode 10, so that passive layer is not formed.

Therefore, the silicon substrate 1 and capacitor lower electrode 10 in which passive layer is formed are not etched, while the low resistance polycrystalline silicon residue 11 is selectively removed chemically by alkaline etching by KOH.

Figure 6:
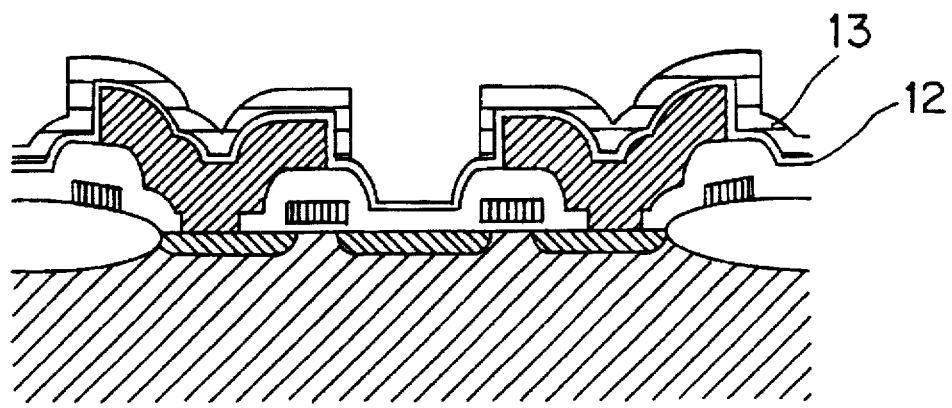

As shown in FIG. 6, the capacitor dielectric film 12 is formed on the capacitor lower electrode 10. This capacitor dielectric film 12 is composed of a single layer film such as thermal oxide film, a multi-layer film such as composition of silicon oxide film/silicon nitride film/silicon oxide film, or $Ta_2O_5$ or the like.

After forming the low resistance polycrystalline silicon film layer (not shown) by CVD method, the capacitor upper electrode 13 is formed by lithographic technique and dry etching technique.

Figure 7:
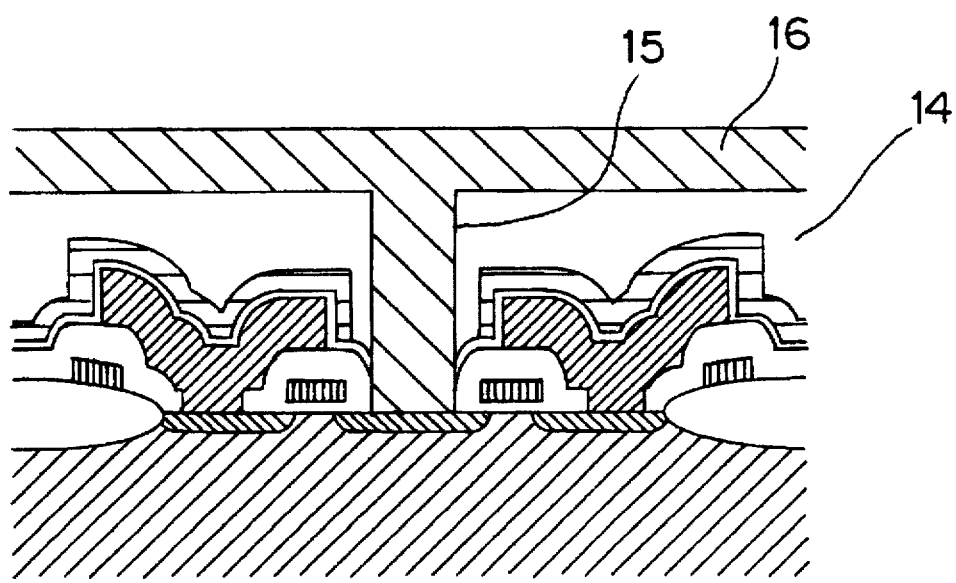

As shown in FIG. 7, by using the CVD method, the interlayer insulating film 14 is formed on the entire surface. Then, by lithographic technique and dry etching technique, the opening 15 is formed in the region positioned above the interlayer insulating films 6 and 14 and $n^+$ impurity diffusion layer 5b. As a result, part of the $n^+$ impurity diffusion layer 5b is exposed.

By the CVD method, a low resistance polycrystalline silicon film (not shown) is formed so as to connect electrically with the exposed $n^+$ impurity diffusion layer 5b and extend over the interlayer insulating film 14, and the bit line electrode 16 is formed by lithographic technique and dry etching technique.

Embodiment 2

FIGS. 1 to 7 and FIG. 8 are process sectional diagrams showing a manufacturing method of semiconductor device in a second embodiment of the invention.

Figure 8:
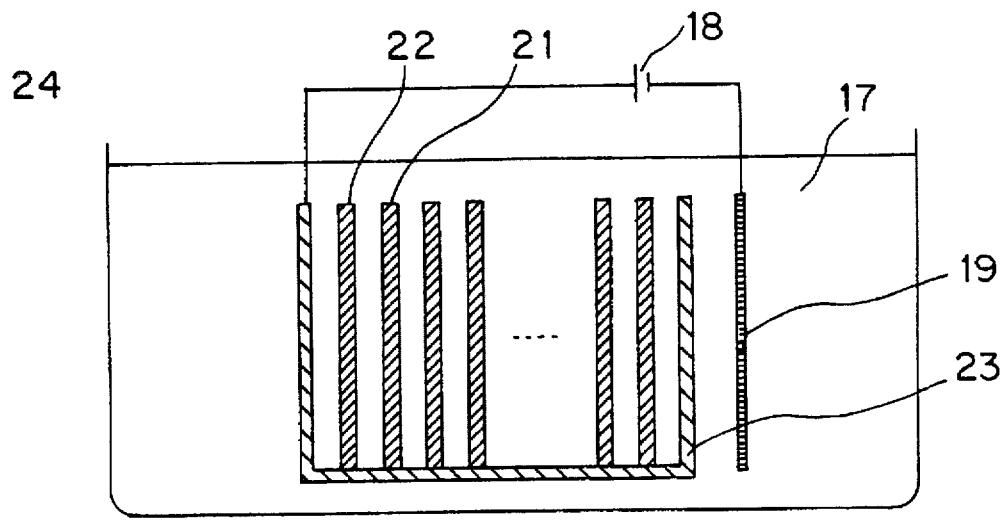
FIG. 8 schematically illustrates etching plural substrates in accordance with an embodiment of the present invention.

In FIG. 8, reference numeral 17 is a chemical etching solution, 18 is a direct-current voltage power source, 19 is a grounding electrode, 21 is a silicon substrate, 22 is a principal surface of the silicon substrate 21, 23 is a conductive silicon substrate cassette, and 24 is a wet removing device comprising the chemical etching solution 17, direct-current voltage power source 18, grounding electrode 19, and conductive silicon substrate cassette 23.

FIG. 1 to FIG. 7 are as mentioned in the first embodiment, and FIG. 8 shows the process sectional view using instead of FIG. 5.

In this embodiment, as shown in FIG. 8, plural silicon substrates 21 are set on the conductive silicon substrate cassette 23, and with the conductive silicon substrate cassette 23 connected electrically to the side of the silicon substrates 21, the low resistance polycrystalline silicon residue 11 shown in FIG. 4 is selectively removed by etching chemically while applying a direct-current voltage to the silicon substrate cassette 23 by using the wet removing device 24 comprising the chemical etching solution 17, direct-current voltage power source 18, grounding electrode 19, and conductive silicon substrate cassette 23.

When the chemical etching solution is 5N KOH heated to 60° C., by applying a direct-current voltage of several volts to several 10 volts to the silicon substrate cassette 23, voltage is applied also to the silicon substrates 21, and moreover the capacitor lower electrode 10 shown in FIG. 4 is also at the same potential as the silicon substrates 21, and a passive layer for stopping electrochemical etching is formed on the surface of the silicon substrates 21 and capacitor lower electrode 10.

Since voltage is not applied to the low resistance polycrystalline silicon residue 11, or if applied, the voltage is lowered through the capacitor lower electrode 10, passive layer is not formed, so as to be removed chemically by alkaline etching by KOH, while the silicon substrate 21 and capacitor lower electrode 10 forming the passive layer is not etched.

Thus, in the embodiment, by using the conductive silicon substrate cassette, the low resistance polycrystalline silicon residue 11 can be removed simultaneously and easily from the plural silicon substrates 21.

Embodiment 3

FIGS. 1 to 7 and FIG. 9 are process sectional diagrams showing a manufacturing method of semiconductor device in a third embodiment of the invention.

Figure 9:
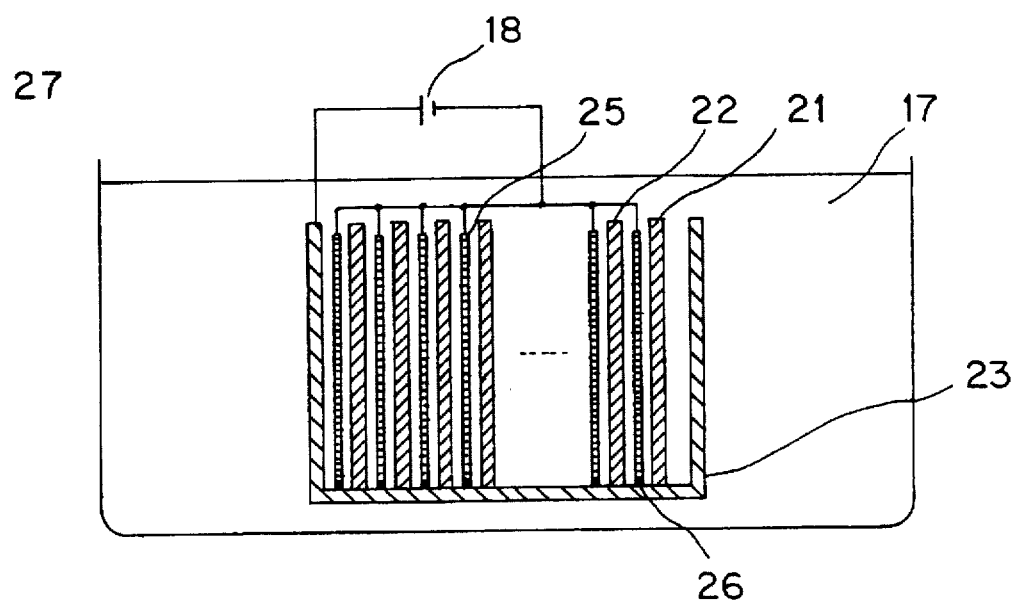
FIG. 9 schematically illustrates etching plural substrates in accordance with another embodiment of the present invention.

In FIG. 9, reference numeral 17 is a chemical etching solution, 18 is a direct-current voltage power source, 21 is a silicon substrate, 22 is a principal surface of the silicon substrate 21, 23 is a conductive silicon substrate cassette, 25 is a grounding electrode fixed to the silicon substrate cassette 23 parallel at a specific distance from the principal surface 22 of the silicon substrate 21, 26 is an insulator for fixing the grounding electrode 25 by electrically insulating to the conductive silicon substrate cassette 23, and 27 is a wet removing device comprising the chemical etching solution 17, direct-current voltage power source 18, grounding electrode 25, conductive silicon substrate cassette 23, and fixing insulator 26.

FIG. 1 to FIG. 7 are as mentioned in the first embodiment, and FIG. 9 shows the process sectional view using instead of FIG. 5.

In this embodiment, as shown in FIG. 9, silicon substrates 21 are set on the conductive silicon substrate cassette 23 so that the principal surfaces 22 of the silicon substrates 21 may be in the same direction, and with the conductive silicon substrate cassette 23 connected electrically to the side of the silicon substrates 21, the low resistance polycrystalline silicon residue 11 shown in FIG. 4 is selectively removed by etching chemically while applying a direct-current voltage to the silicon substrate cassette 23 by using the wet removing device 27 comprising the chemical etching solution 17, direct-current voltage power source 18, grounding electrode 25, conductive silicon substrate cassette 23, and fixing insulator 26.

When the chemical etching solution is 5N KOH heated to 60° C., by applying a direct-current voltage of several volts to several 10 volts to the silicon substrate cassette 23, voltage is applied to the silicon substrates 21, and moreover the capacitor lower electrode 10 shown in FIG. 4 is also at the same potential as the silicon substrates 21, and a passive layer for stopping electrochemical etching is formed on the surface of the silicon substrates 21 and capacitor lower electrode 10. Since voltage is not applied to the low resistance polycrystalline silicon residue 11, or if applied, the voltage is lowered through the capacitor lower electrode 10, passive layer is not formed, so as to be removed chemically by alkaline etching by KOH, while the silicon substrate 21 and capacitor lower electrode 10 forming the passive layer is not etched.

Thus, in the embodiment, by using the conductive silicon substrate cassette, the low resistance polycrystalline silicon residue 11 can be removed simultaneously and easily from the plural silicon substrates 21, and moreover by positioning the grounding electrode 25 in the grounding state parallel to the silicon substrate 21, the uniformity of etching is enhanced.

Embodiment 4

FIGS. 1 to 7 and FIG. 10 are process sectional diagrams showing a manufacturing method of semiconductor device in a fourth embodiment of the invention.

Figure 10:
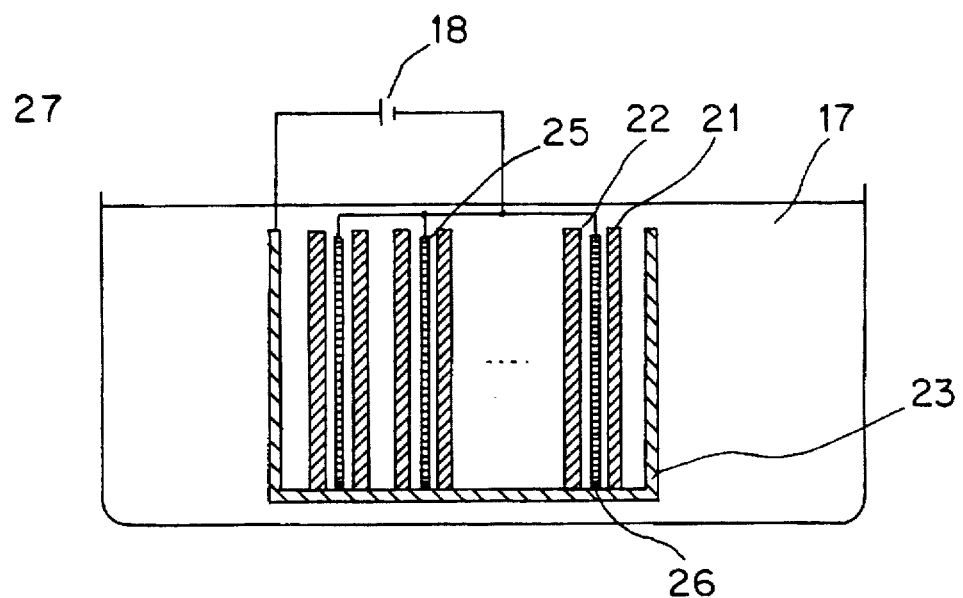
FIG. 10 schematically illustrates another embodiment for uniformly etching plural silicon substrates in accordance with the present invention.

In FIG. 10, reference numeral 17 is a chemical etching solution, 18 is a direct-current voltage power source, 21 is a silicon substrate, 22 is a principal surface of the silicon substrate 21, 23 is a conductive silicon substrate cassette, 25 is a grounding electrode fixed to the silicon substrate cassette 23 parallel at a specific distance from the principal surface 22 of the silicon substrate 21, 26 is an insulator for fixing the grounding electrode 25 by electrically insulating to the conductive silicon substrate cassette 23, and 27 is a wet removing device comprising the chemical etching solution 17, direct-current voltage power source 18, grounding electrode 25, conductive silicon substrate cassette 23, and fixing insulator 26.

FIG. 1 to FIG. 7 are as mentioned in the first embodiment, and FIG. 10 shows the process sectional view using instead of FIG. 5.

As shown in FIG. 10, silicon substrates 21 are set on the conductive silicon substrate cassette 23 so that the principal surfaces 22 of the silicon substrates 21 may confront each other, and with the conductive silicon substrate cassette 23 connected electrically to the side of the silicon substrates 21, the low resistance polycrystalline silicon residue 11 shown in FIG. 4 is selectively removed by etching chemically while applying a direct-current voltage to the silicon substrate cassette 23 by using the wet removing device 27 comprising the chemical etching solution 17, direct-current voltage power source 18, grounding electrode 25, conductive silicon substrate cassette 23, and fixing insulator 26.

When the chemical etching solution is 5N KOH heated to 60° C., by applying a direct-current voltage of several volts to several 10 volts to the silicon substrate cassette 23, voltage is applied to the silicon substrates 21, and moreover the capacitor lower electrode 10 shown in FIG. 10 is also at the same potential as the silicon substrates 21, and a passive layer for stopping electrochemical etching is formed on the surface of the silicon substrates 21 and capacitor lower electrode 10.

Since voltage is not applied to the low resistance polycrystalline silicon residue 11, or if applied, the voltage is lowered through the capacitor lower electrode 10, passive layer is not formed, so as to be removed chemically by alkaline etching by KOH, while the silicon substrate 21 and capacitor lower electrode 10 forming the passive layer is not etched.

Thus, in the embodiment, by using the conductive silicon substrate cassette, the low resistance polycrystalline silicon residue 11 can be removed simultaneously and easily from the plural silicon substrates 21, and moreover the uniformity of etching is enhanced, and the number of grounding electrodes 25 may be half the number of silicon substrates 21.

Embodiment 5

FIGS. 1 to 7 and FIG. 11 are process sectional diagrams showing a manufacturing method of semiconductor device in a fifth embodiment of the invention.

Figure 11:
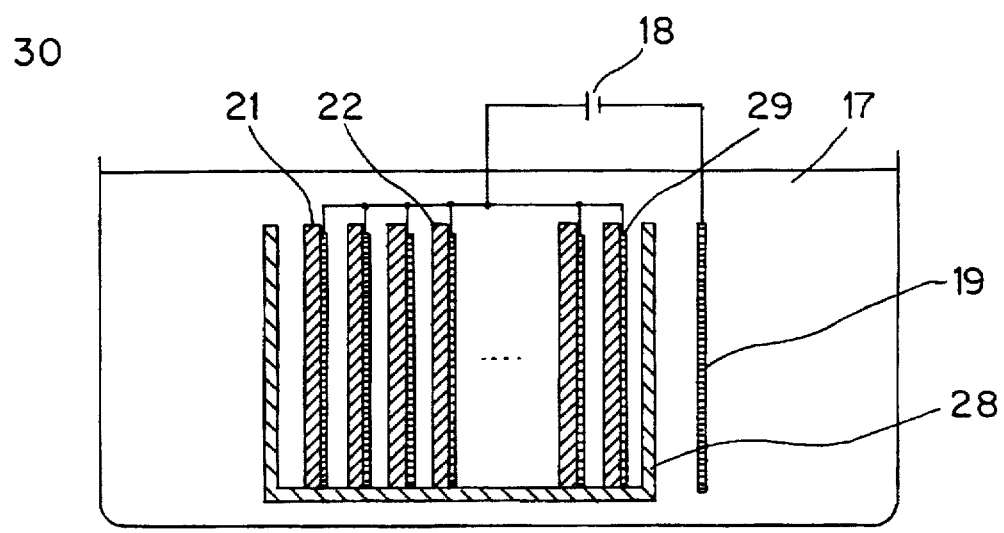
FIG. 11 schematically illustrates a further embodiment of the present invention for etching plural silicon substrates.

In FIG. 11, reference numeral 17 is a chemical etching solution, 18 is a direct-current voltage power source, 19 is a grounding electrode, 21 is a silicon substrate, 22 is a principal surface of the silicon substrate 21, 28 is a silicon substrate cassette, 29 is an electrode fixed to the silicon substrate cassette 28 so as to contact with the back side of the silicon substrate 21, and 30 is a wet removing device comprising the chemical etching solution 17, direct-current voltage power source 18, grounding electrode 19, silicon substrate cassette 28, and electrode 29.

FIG. 1 to FIG. 7 are as mentioned in the first embodiment, and FIG. 11 shows the process sectional view using instead of FIG. 5.

As shown in FIG. 11, silicon substrates 21 are set on the silicon substrate cassette 28, and with the electrode 29 electrically connected to the back side of the silicon substrates 21, the low resistance polycrystalline silicon residue 11 shown in FIG. 4 is selectively removed by etching chemically while applying a direct-current voltage to the electrode 29 fixed to the silicon substrate cassette 28 by using the wet removing device 30 comprising the chemical etching solution 17, direct-current voltage power source 18, grounding electrode 19, silicon substrate cassette 28, and electrode 29.

When the chemical etching solution is 5N KOH heated to 60° C., by applying a direct-current voltage of several volts to several 10 volts to the electrode 29, voltage is applied to the silicon substrates 21, and moreover the capacitor lower electrode 10 shown in FIG. 4 is also at the same potential as the silicon substrates 21, and a passive layer for stopping electrochemical etching is formed on the surface of the silicon substrates 21 and capacitor lower electrode 10.

Since voltage is not applied to the low resistance polycrystalline silicon residue 11, or if applied, the voltage is lowered through the capacitor lower electrode 10, passive layer is not formed, so as to be removed chemically by alkaline etching by KOH, while the silicon substrate 21 and capacitor lower electrode 10 forming the passive layer is not etched.

Thus, in this embodiment, since voltage is applied to the back side of the silicon substrates 21 from the electrode 29 fixed to the silicon substrate cassette 28, the uniformity of the voltage applied to the principal surface 22 of the silicon substrate is enhanced, and the controllability of etching is enhanced.

Embodiment 6

FIGS. 1 to 7 and FIG. 12 are process sectional diagrams showing a manufacturing method of semiconductor device in a sixth embodiment of the invention.

Figure 12:
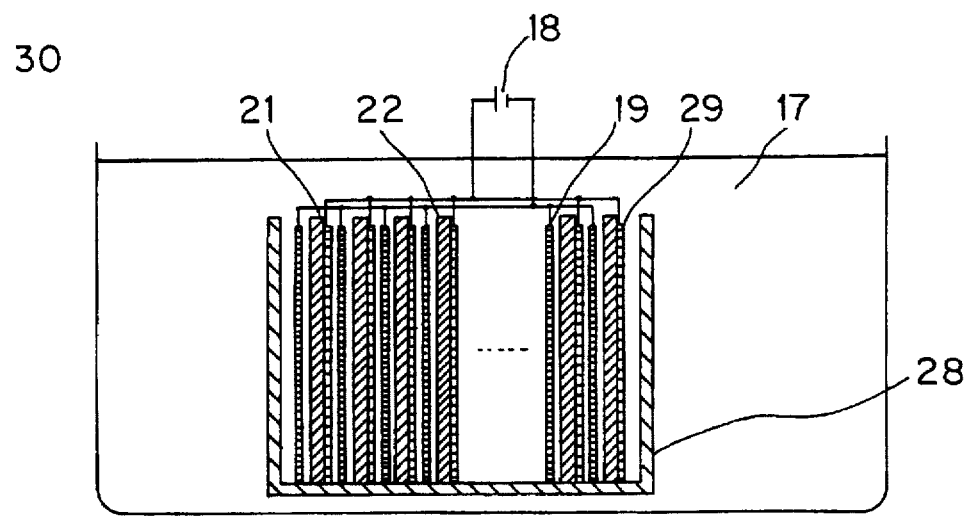
FIG. 12 schematically illustrates another embodiment of the present invention wherein the plural silicon substrates are etched.

In FIG. 12, reference numeral 17 is a chemical etching solution, 18 is a direct-current voltage power source, 21 is a silicon substrate, 22 is a principal surface of the silicon substrate 21, 28 is a non-conductive silicon substrate cassette, 19 is a grounding electrode fixed to the non-conductive silicon substrate cassette parallel at a specific distance from the principal surface 22 of the silicon substrate 21, 29 is an electrode fixed to the non-conductive silicon substrate cassette 28 so as to contact with the back side of the silicon substrate 21, and 30 is a wet removing device comprising the chemical etching solution 17, direct-current voltage power source 18, grounding electrode 19, non-conductive silicon substrate cassette 28, and electrode 29.

FIG. 1 to FIG. 7 are as mentioned in the first embodiment, and FIG. 12 shows the process sectional view using instead of FIG. 5.

As shown in FIG. 12, silicon substrates 21 are set on the non-conductive silicon substrate cassette 28 so that the principal surfaces 22 of the silicon substrates may face in the same direction, and with the electrode 29 electrically connected to the back side of the silicon substrates 21, the low resistance polycrystalline silicon residue 11 shown in FIG. 4 is selectively removed by etching chemically while applying a direct-current voltage to the electrode 29 fixed to the non-conductive silicon substrate cassette 28 by using the wet removing device 30 comprising the chemical etching solution 17, direct-current voltage power source 18, grounding electrode 19, non-conductive silicon substrate cassette 28, and electrode 29.

When the chemical etching solution is 5N KOH heated to 60° C., by applying a direct-current voltage of several volts to several 10 volts to the electrode 29, voltage is applied to the silicon substrates 21, and moreover the capacitor lower electrode 10 shown in FIG. 4 is also at the same potential as the silicon substrates 21, and a passive layer for stopping electrochemical etching is formed on the surface of the silicon substrates 21 and capacitor lower electrode 10.

Since voltage is not applied to the low resistance polycrystalline silicon residue 11, or if applied, the voltage is lowered through the capacitor lower electrode 10, passive layer is not formed, so as to be removed chemically by alkaline etching by KOH, while the silicon substrate 21 and capacitor lower electrode 10 forming the passive layer is not etched.

Thus, in the embodiment, since the grounding electrode 19 fixed to the non-conductive silicon substrate cassette 28 is positioned parallel to the silicon substrate 21, uniformity of etching is enhanced, and moreover since voltage is applied to the silicon substrates 21 from the electrode 29 fixed to the non-conductive silicon substrate cassette 28, the uniformity of the voltage applied to the principal surfaces 22 of silicon substrates is enhanced, so that the controllability and stability of etching may be improved.

Embodiment 7

FIGS. 1 to 7 and FIG. 13 are process sectional diagrams showing a manufacturing method of semiconductor device in a seventh embodiment of the invention.

Figure 13:
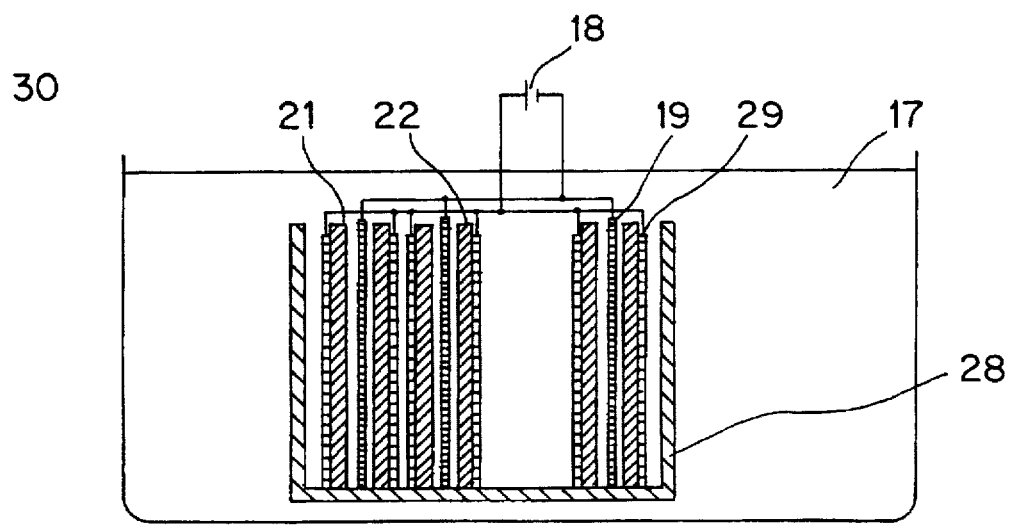
FIG. 13 schematically illustrates yet another embodiment of the present invention wherein plural silicon substrates are etched.
Figure 14:
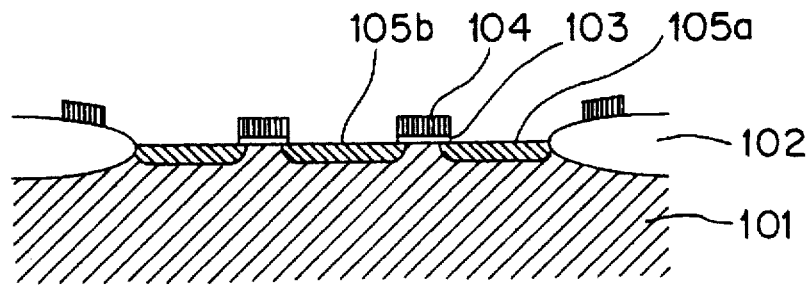
FIGS. 14 through 19 schematically illustrate sequential stages of prior art methodology.
Figure 15:
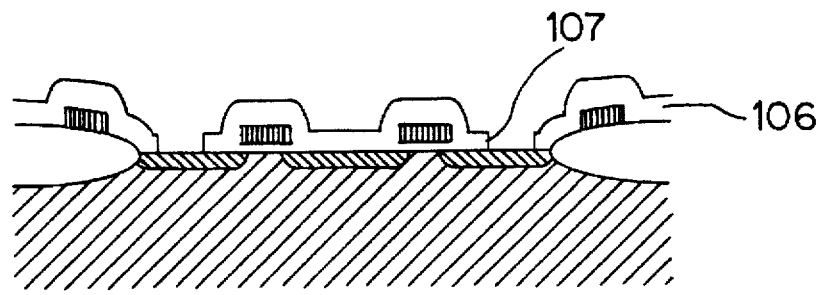
Figure 16:
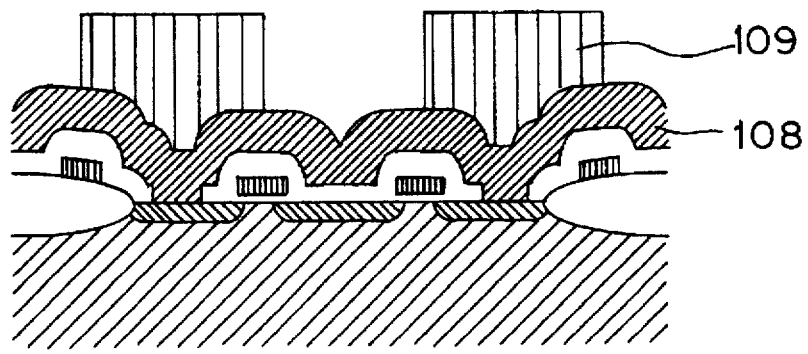
Figure 17:
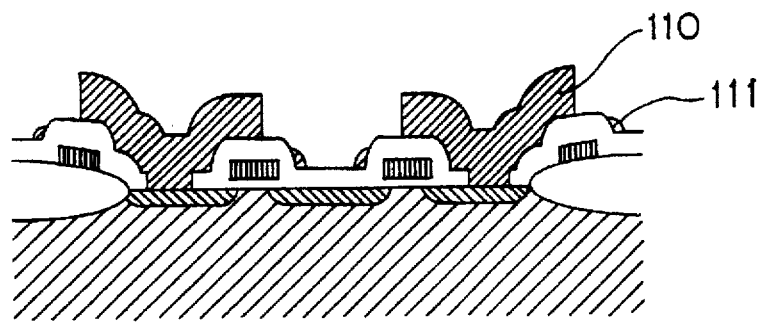
Figure 18:
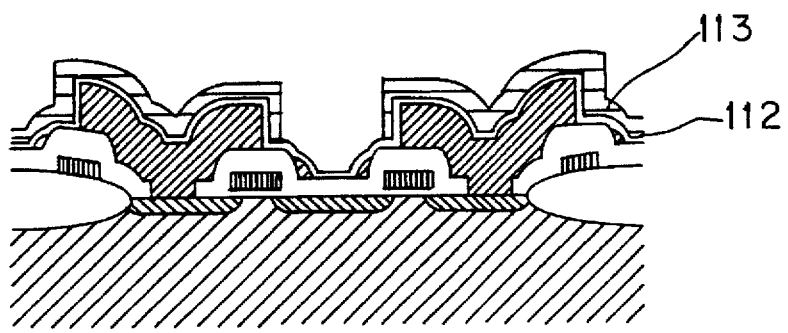
Figure 19:
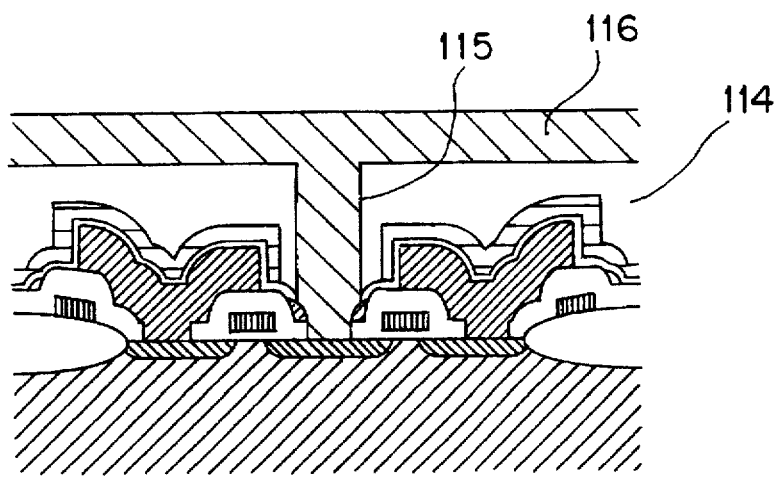
Figure 20:
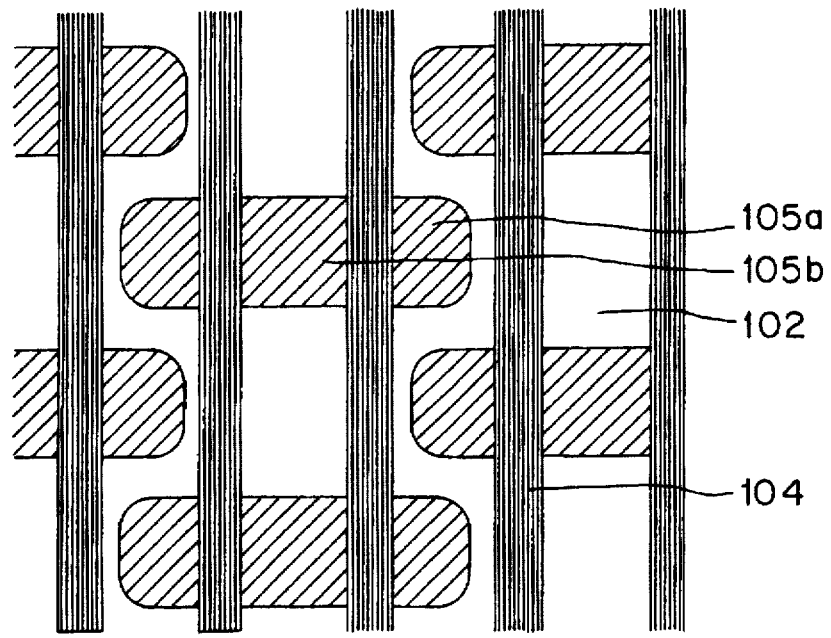
FIGS. 20 through 25 are plan views schematically illustrating sequential stages of conventional manufacturing technique.
Figure 21:
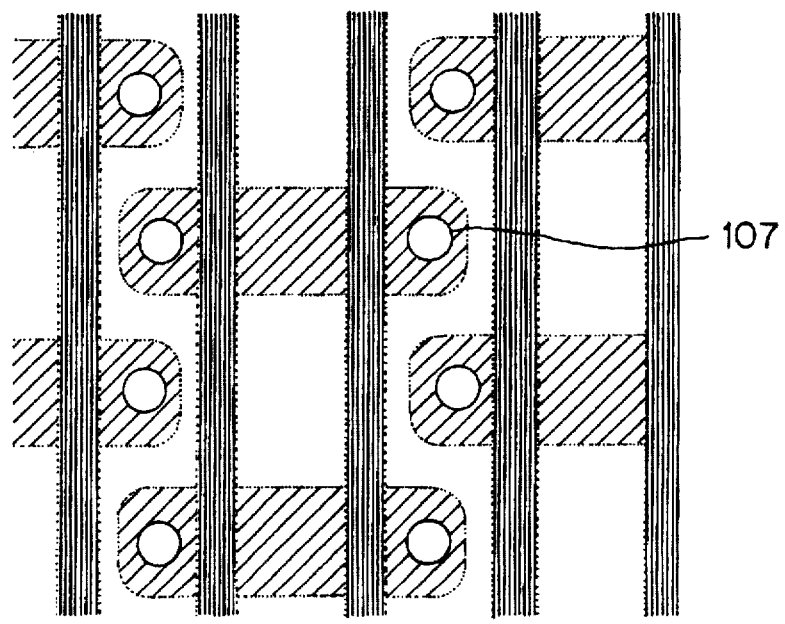
Figure 22:
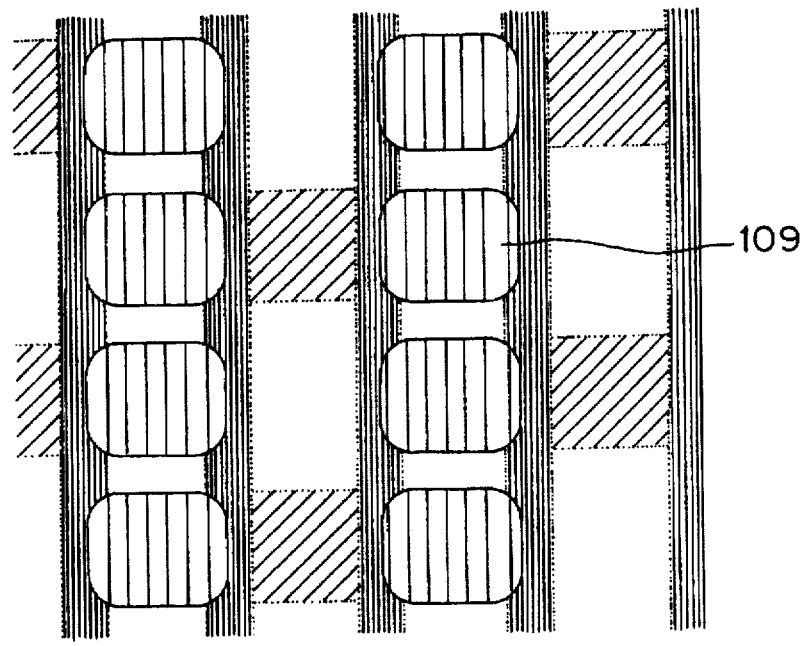
Figure 23:
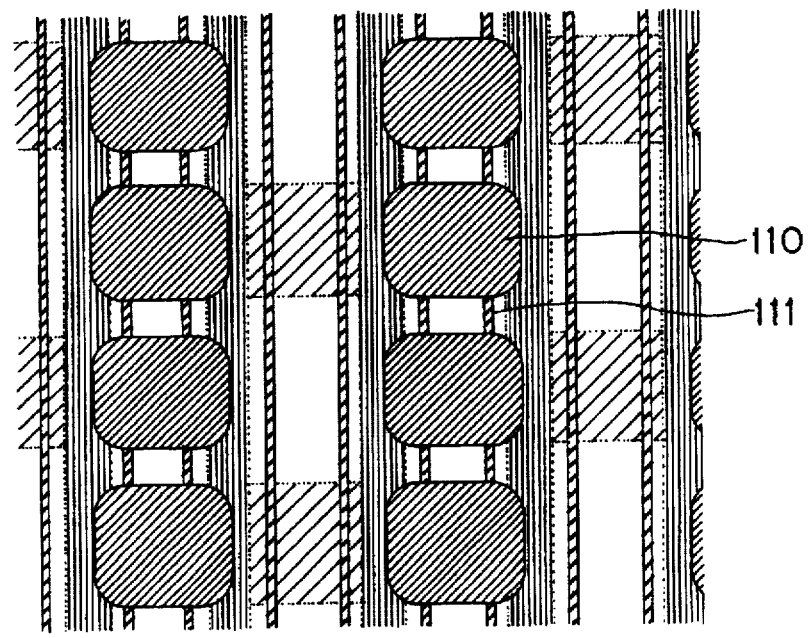
Figure 24:
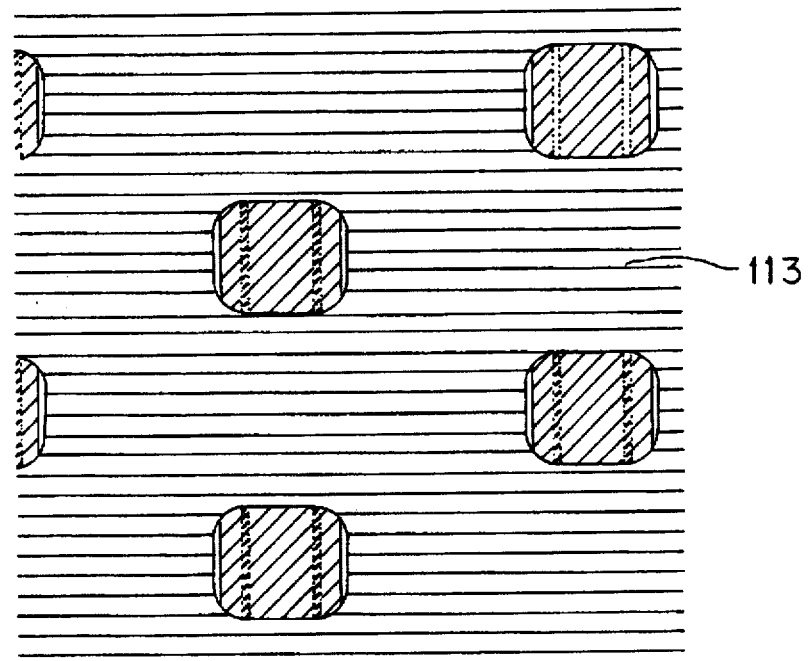
Figure 25:
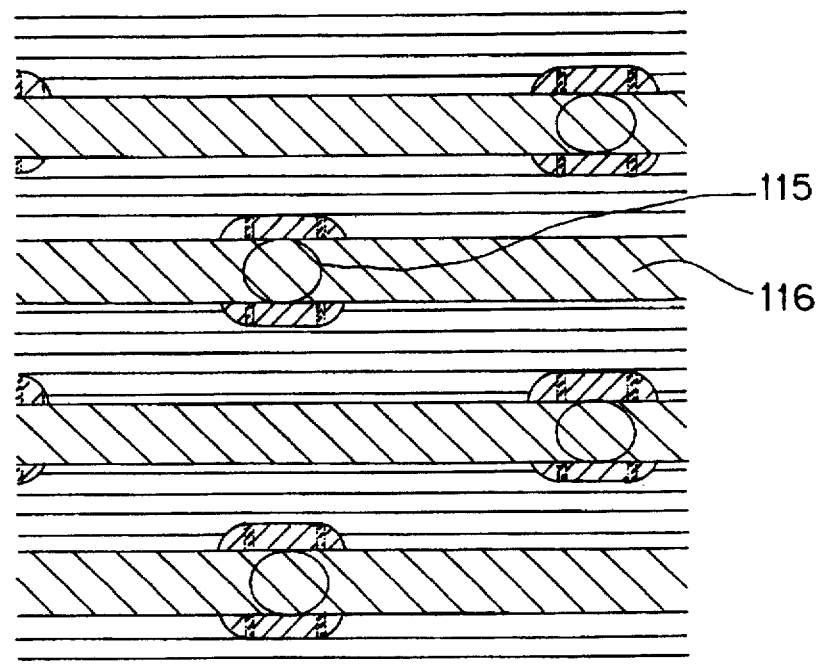

In FIG. 13, reference numeral 17 is a chemical etching solution, 18 is a direct-current voltage power source, 21 is a silicon substrate, 22 is a principal surface of the silicon substrate 21, 28 is a non-conductive silicon substrate cassette, 19 is a grounding electrode fixed to the non-conductive silicon substrate cassette 28 parallel at a specific distance from the principal surface 22 of the silicon substrate 21, 29 is an electrode fixed to the non-conductive silicon substrate cassette 28 so as to contact with the back side of the silicon substrate 21, and 30 is a wet removing device comprising the chemical etching solution 17, direct-current voltage power source 18, grounding electrode 19, non-conductive silicon substrate cassette 28, and electrode 29.

FIG. 1 to FIG. 7 are as mentioned in the first embodiment, and FIG. 13 shows the process sectional view using instead of FIG. 5.

As shown in FIG. 13, silicon substrates 21 are set on the non-conductive silicon substrate cassette 28 so that the principal surfaces 22 of the silicon substrates may confront each other, and with the electrode 29 electrically connected to the back side of the silicon substrates 21, the low resistance polycrystalline silicon residue 11 shown in FIG. 4 is selectively removed by etching chemically while applying a direct-current voltage to the electrode 29 fixed to the non-conductive silicon substrate cassette 28 by using the wet removing device 30 comprising the chemical etching solution 17, direct-current voltage power source 18, grounding electrode 19, non-conductive silicon substrate cassette 28, and electrode 29.

When the chemical etching solution is 5N KOH heated to 60° C., by applying a direct-current voltage of several volts to several 10 volts to the electrode 29, voltage is applied to the silicon substrates 21, and moreover the capacitor lower electrode 10 shown in FIG. 4 is also at the same potential as the silicon substrates 21, and a passive layer for stopping electrochemical etching is formed on the surface of the silicon substrates 21 and capacitor lower electrode 10.

Since voltage is not applied to the low resistance polycrystalline silicon residue 11, or if applied, the voltage is lowered through the capacitor lower electrode 10, passive layer is not formed, so as to be removed chemically by alkaline etching by KOH, while the silicon substrate 21 and capacitor lower electrode 10 forming the passive layer is not etched.

Thus, in the embodiment, since the grounding electrode 19 fixed to the non-conductive silicon substrate cassette 28 is positioned parallel to the silicon substrates 21, uniformity of etching is enhanced, and moreover since the voltage is applied to the silicon substrates 21 from the electrode 29 fixed to the non-conductive silicon substrate cassette 28, uniformity of voltage applied to the principal surfaces 22 of silicon substrates is enhanced, and the controllability and stability of etching are improved, and further the required number of grounding electrodes 19 may be half the number of silicon substrates 21.

As clear from the description herein, according to the invention, only by feeding current to part of the silicon substrates, the etching residue in non-conductive state of the silicon left over on the interlayer insulating film can be selectively removed while protecting the element surface fabricated on the silicon substrates, and shorting of the circuits of the semiconductor device can be prevented, and the operation of etching process is superior, and in particular it is easier to etch plural silicon substrates simultaneously, thereby contributing to enhancement of mass producibility.

When etching plural silicon substrates simultaneously, by using the conductive substrate cassette of the invention, only by connecting the power source positive electrode to the cassette main body, a positive potential can be applied to all silicon substrates disposed in conductive state on the cassette from their surrounding, so that a great number of silicon substrates can be processed easily by simultaneous etching, thereby enhancing the mass producibility of semiconductor elements.

In the silicon substrate cassette, by disposing the grounding electrodes so as to confront the silicon substrates, the intra-plane uniformity of etching is enhanced, and the manufacturing yield of the semiconductor element can be enhanced.

Moreover, using the non-conductive silicon substrate cassette of the invention, by applying a positive potential from the back side to the silicon substrates disposed in contact with the electrodes through flat silicon substrate application electrodes disposed on the cassette, and moreover by disposing the grounding electrodes so as to confront the silicon substrate, the intra-plane uniformity of etching is enhanced, and the manufacturing yield of semiconductor elements can be improved.

What is claimed is:

1. A manufacturing method of semiconductor device, which method comprises:

etching a conductive layer formed on an interlayer insulating film and electrically connected to a surface of an underlying silicon substrate, whereby an etching residue of the conductive layer is formed on the interlayer insulating film; anodically oxidizing the surface of the silicon substrate and a portion of the remaining conductive layer in an alkaline bath to form a passive film thereon; and isotropically etching to remove the residue on the interlayer insulating film in an alkaline bath, wherein anodic oxidation and isotropic etching are conducted at the same time in the same alkaline bath.

2. A method according to claim 1, wherein the residue on the interlayer insulating film is polycrystalline silicon.

3. A method according to claim 1, comprising applying a positive potential of several volts to 10 volts to the silicon substrate to effect anodic oxidation.

4. A method according to claim 1, wherein the chemical etching solution comprises a solution of a member selected from the group consisting of KOH, NaOH, LiOH, CsOH, $NH_4OH$, ethylene diamine pyrocatechol, hydrazine, and choline.

5. A method according to claim 1, wherein the temperature of the chemical etching solution is 60° to 70° C.

6. A method according to claim 1, wherein the chemical etching solution is 5N KOH solution.

7. A method according to claim 1, comprising etching two or more silicon substrates at the same time.

* * * * *